(12) United States Patent
Cuevas et al.

(10) Patent No.: US 7,049,713 B2
(45) Date of Patent: May 23, 2006

(54) PULSED CURRENT GENERATOR CIRCUIT WITH CHARGE BOOSTER

(75) Inventors: Peter Cuevas, Los Gatos, CA (US);
Gedaliahoo Krieger, Rehovot (IL);
Maurice Evans, Pacifica, CA (US);
Jens Ullmann, San Jose, CA (US)

(73) Assignee: Qualitau, Inc., Santa Clara, CA (US)

( * ) Notice: Subject to any disclaimer, the term of this patent is extended or adjusted under 35 U.S.C. 154(b) by 224 days.

(21) Appl. No.: 10/734,002

(22) Filed: Dec. 10, 2003

(65) Prior Publication Data

US 2005/0128655 A1  Jun. 16, 2005

(51) Int. Cl.
*H02M 3/06* (2006.01)
(52) U.S. Cl. .................................. 307/109; 307/110
(58) Field of Classification Search ................ 307/106, 307/109, 110
See application file for complete search history.

(56) References Cited

U.S. PATENT DOCUMENTS 4,362,955 A * 12/1982 Davenport .................. 327/170
6,249,137 B1   6/2001 Krieger et al. .............. 324/765

OTHER PUBLICATIONS

International Search Report in corresponding PCT application PCT/US04/40591 mailed Oct. 24, 2005.
Written Opinion in corresponding PCT application PCT/US04/40591 mailed Oct. 24, 2005.

* cited by examiner

*Primary Examiner*—Robert L. Deberadinis
(74) *Attorney, Agent, or Firm*—Beyer Weaver & Thomas LLP

(57) ABSTRACT

A pulsed current generator circuit for providing current pulses to a device under test includes a current source for applying a current to the device under test and a controlled current shunt for shunting current from the device under test. A booster circuit is provided for supplying a booster current to the device under test when the controlled current shunt is opened and current again flows through the device under test, thereby facilitating recharge of a parasitic capacitance associated with the device under test.

9 Claims, 5 Drawing Sheets

PULSED CURRENT GENERATOR CIRCUIT WITH CHARGE BOOSTER

FIELD OF THE INVENTION

This invention relates generally to circuitry for testing electrical components and circuits, and more particularly the invention relates to current pulse circuitry for use in such testing.

BACKGROUND OF THE INVENTION

Current pulses are often employed in testing electrical components and circuits. When high repetition rate current pulses are required, for example with pulsed electromigration tests, the desired pulse waveform is usually rectangular. Therefore, the transitions between current levels must be abrupt with minimal overshoot to effectively provide the intended current drive at each level. See FIG. 1 for bipolar and unipolar current pulses, respectively. Ideally, the transition from ground level ("0") to the required current ("Ap" or "An", or generally "A" for simplicity) is abrupt, as show in FIG. 1. In reality, however, such transitions take time and can be too slow to reach the required maximum level A.

An effective technique to achieve current pulses is implemented by connecting a constant (DC) current source to ground and thereby shunting the current from a device under test (DUT) as shown in FIG. 2. Here, current flow through the device under test (DUT) is shunted to ground by shunt transistor, Qs, in response to a control signal at point P which is connected through resistor Rx to shunt transistor Qs. The desired waveform is achieved in response to the timing generator having a required period T, "on" time t and "off" time (T-t). See for example Krieger et al. U.S. Pat. No. 6,249,137 for CIRCUIT AND METHOD FOR PULSED RELIABILITY TESTING.

In general, it is relatively easy to generate an ideal driving pulse at the gate of the main shunting transistor Qs (point "P" in FIG. 2). Similarly, modern power transistors can provide both very low on resistance and very fast intrinsic transition between their on and off states in both directions. A problem is the parasitic capacitance Co between the output node "C" and Ground (Gnd), which includes the output capacitance of Qs, any stray capacitance associated with the DUT, the output capacitance of the DC current source and any other capacitance introduced by the test setup, such as cables or test fixtures. Reducing this capacitance to a desirable level is difficult, since it is strongly related to Idc and to the current sinking capability of Qs. With pulsed current applications often requiring wide range of current levels, it is impractical to sacrifice high-current characteristics in favor of low-current performance and vice versa. In fact, the problem is limited to low and perhaps medium currents; however, to assure proper high current operation both Qs and the DC current source must be sufficiently strong, implying large values of Co accordingly.

This limitation is not an issue when voltage pulses, rather than current, are involved. Most voltage sources are capable of driving relatively large currents while trying to reach the intended level (A or Ground, depending on the specific transition); therefore inherently generating fast transitions. In the pulsed current source case, Idc is simply diverted to Qs while it is on, as Co discharges through Qs simultaneously. While Qs is off, Co is charged exponentially to the steady state level Vo=(Rdut)(Idc), with a time constant τ=(Co)(Rdut). As low current applications often require Rdut of several kilo-ohms (kΩ) and Co is rarely less than 20 pF, the resulting time constant is several tens of nanoseconds. On the other hand, since Ron is very small, Co discharges very quickly after Qs enters its on state; thus posing no practical delay.

The present invention is directed to facilitating fast current transition from 0 to A through DUT with transition time, tr, substantially shorter than the related pulse duration, $t_p$, $t_n$, and with an acceptable minimal overshoot.

SUMMARY OF THE INVENTION

In accordance with the invention, a charge boost circuit is provided to facilitate the rapid recharge of parasitic capacitance associated with a DUT when current is re-applied through the DUT. Short bursts of current are provided during the transitions of the shunt transistor from on state to off state, with the magnitude of the charging current being greater than the magnitude of the pulsed current. A current limiter prevents overcharging of the parasitic capacitance thereby avoiding unacceptable overshooting in the resulting current pulse waveform.

The invention and objects and features thereof will be more readily apparent from the following detailed description and appended claims when taken with the drawings.

DETAILED DESCRIPTION OF ILLUSTRATIVE EMBODIMENTS

Figure 1:
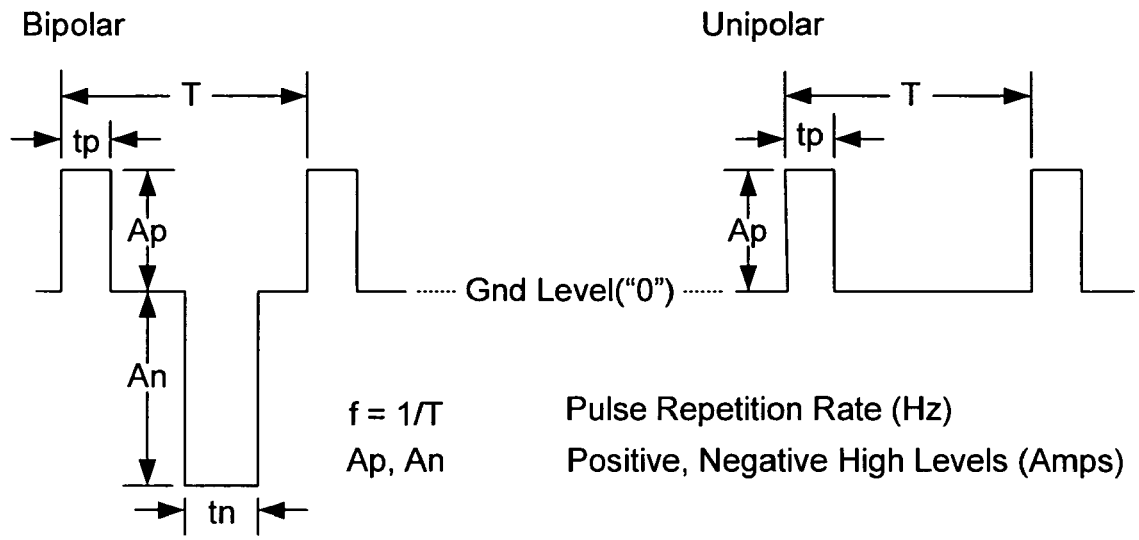
FIG. 1 illustrates bipolar and unipolar current pulses for use in testing electronic devices.
Figure 2:
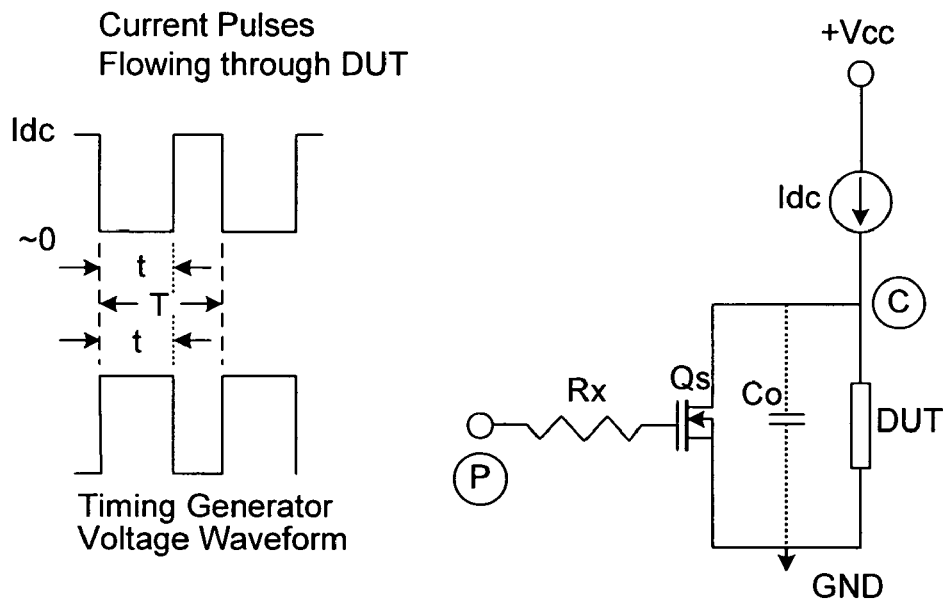
FIG. 2 illustrates a conventional pulse current generator for a DUT.
Figure 3:
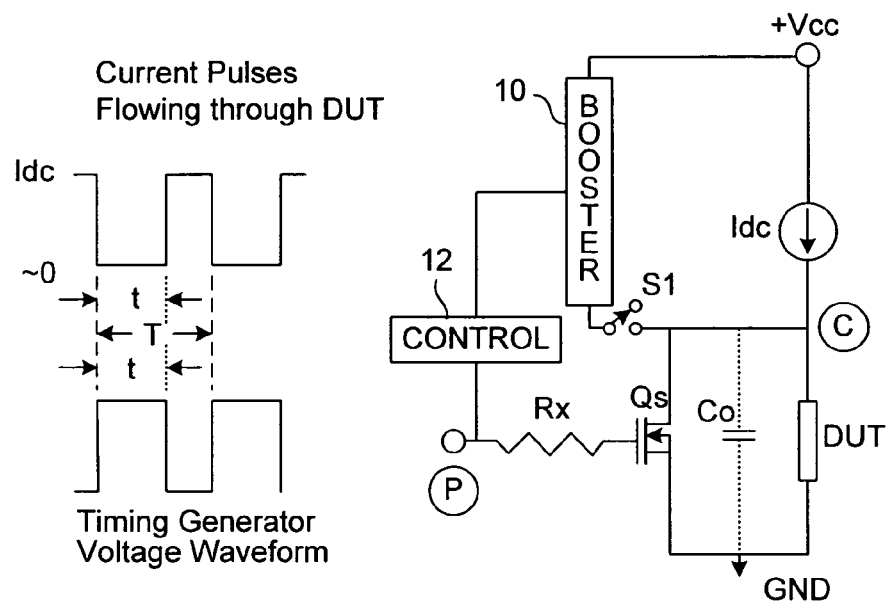
FIG. 3 illustrates a pulsed current generator in accordance with the invention.

FIG. 3 corresponds to the circuit of FIG. 2 with a booster circuit 10 in accordance with the invention for providing short bursts of current during the transitions from the on to off state of shunt transistor Qs. During this transition period, booster circuit 10 provides current through switch S1 which facilitates the charging of parasitic capacitor Co. Since the booster current is much higher than the current Idc from the current source, recharging of the parasitic capacitor is facilitated. Booster circuit 10 and switch S1 respond to control circuitry 12 and the control voltage at node P for shunt transistor Qs.

Figure 4:
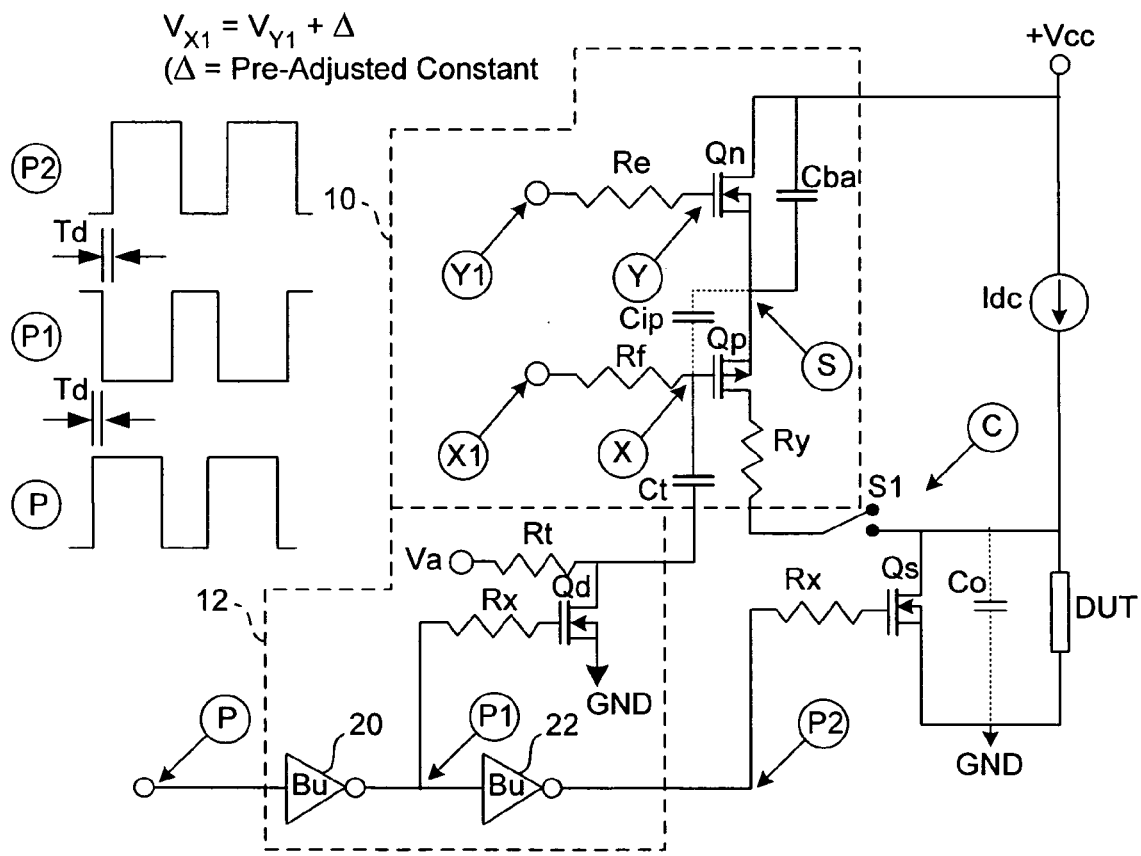
FIG. 4 illustrates one embodiment of a pulse generator and charge booster circuit in accordance with the invention.

FIG. 4 is a schematic of one embodiment of the pulsed Current generator of FIG. 3 which further illustrates booster circuit 10 and control circuit 12. Here the timing generator at terminal P is connected to the gate of the main shunt transistor Qs via two serially connected buffers 20, 22 with each buffer inverting its input signal while adding a small delay (td). The resulting waveforms at P1, P2 and timing generator signal at P are all shown in the figure. Note that the coupling gate resistor Rx is not critical and is commonly added just to avoid direct coupling between the transistor gate and the driving signal.

The rest of the circuit forms the booster shown at 10. The path of the current injected by the booster into the output node C comprises NMOS transistor Qn and PMOS transistor Qp, capacitor Cba and resistor Ry. As booster activation/deactivation is done electronically, the role of switch S1 is just to eliminate any parasitic coupling through stray capacitance and leakage. Resistor Ry sets an upper bound to the boosting current to avoid overheating and large overshoots. Capacitor Cba is sufficiently large (about one AF or more) to assure constant (DC) voltage at the common source node S, even when strong boosting action is required.

Proper operation of the booster is based oil an unambiguous knowledge of the actual conditions at node C in real time and comparing to an intended target. The target is simply a resulting "high" voltage level at node C being the same as the resulting voltage level under similar DC operation. In other words, before the intended timing generator is applied, Idc is set to the required level and the resulting voltage at node C is measured and acquired. Next, the timing generator is activated and the resulting voltage at C is measured, using a peak detector which acquires the highest level of the measured waveform (peak detector not shown). As the whole idea is to have Idc flowing into the DUT while the main shunting transistor Qs is off, this peak, being exactly the same as observed under similar DC conditions, assures proper operation. Measuring lower or higher level will turn the boosting action up or down, respectively, in an iterative algorithm which assures proper convergence after a few such steps.

Figure 5:
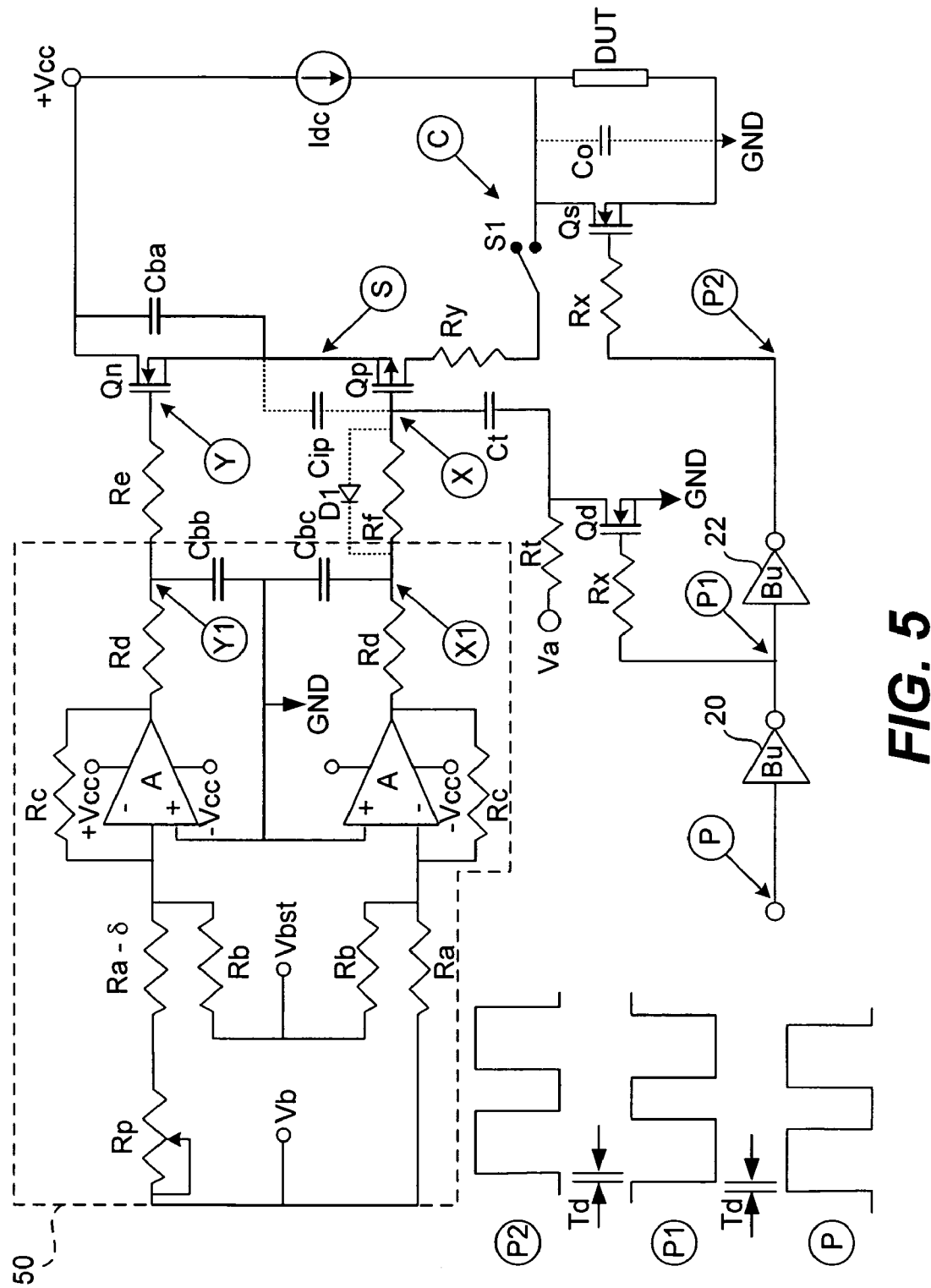
FIG. 5 illustrates another embodiment of a pulse generator and charge booster circuit in accordance with the invention.
Figure 6:
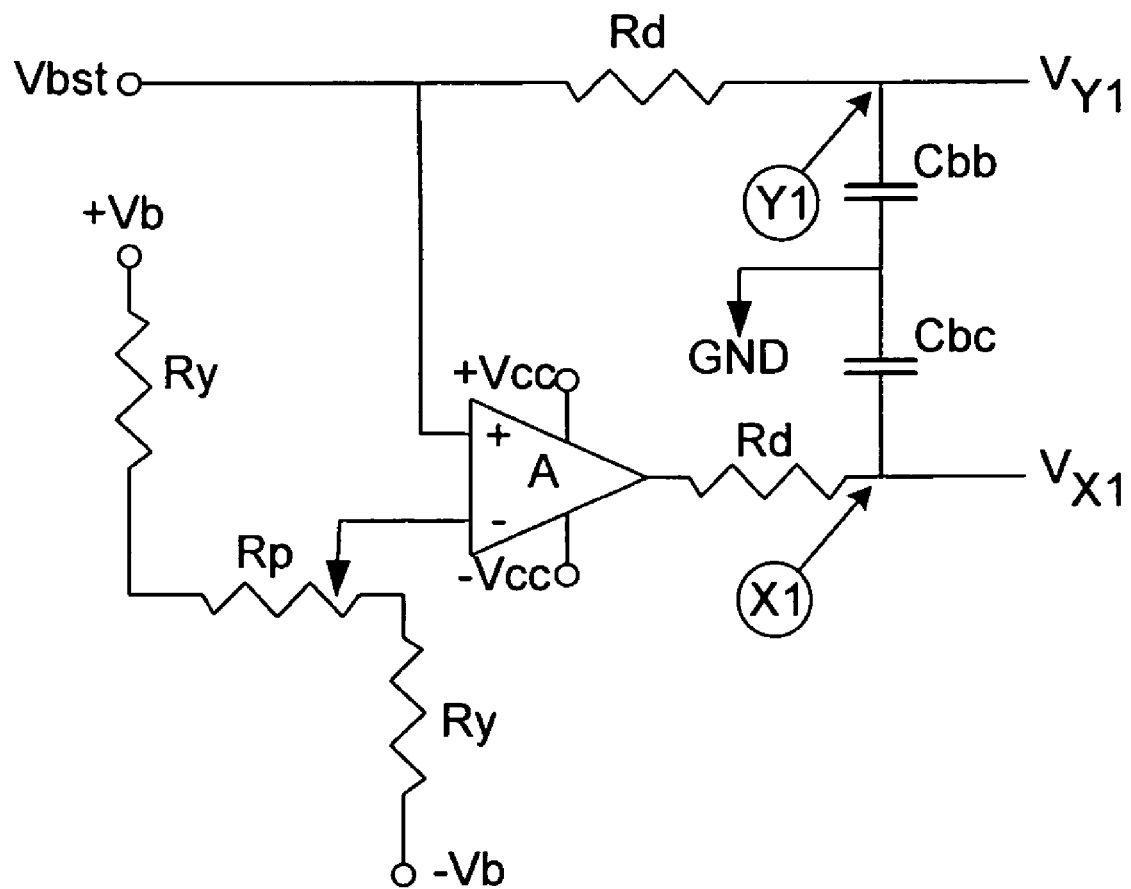
FIG. 6 illustrates another embodiment of a charge booster circuit in accordance with the invention.

To implement the above, the voltage levels at Y1 and X1 must be set appropriately based on the related data from the peak detector at node C. First and foremost, no DC current can flow through Qp, meaning that as long as the timing signal at P is not applied either Qp or Qn is off. This requirement is satisfied by the following relation:

$$V_{X1} - V_{Y1} > Vtp - Vtn$$

where Vtn is positive for enhancement devices and negative for depletion, while Vtp is negative for enhancement and positive for depletion. In particular, when a combination of depletion NMOS transistor (Qn) and enhancement PMOS transistor (Qp) is selected and assuming that their absolute values are about the same (i.e. |Vtn|≈|Vtp|), setting $V_{X1}$ slightly higher than $V_{Y1}$ assures no DC current flow through Qp. In reality, an extra "safety margin" of a few tenths of a volt may be added as part of circuit adjustment during production. Once the optimal difference $V_{X1}-V_{Y1}$ is known, the system must keep it for each and every level. In this respect, the implementation shown in FIG. 4 is unnecessarily cumbersome as it requires two independent adjustable voltage sources, while only one of them is varied by the internal algorithm, as the other is at constant distance from it (i.e. $V_{X1}=V_{Y1}+\Delta$, where $\Delta$ is the pre-adjusted constant described above). Two other embodiments, where the above is achieved with one adjustable voltage source and another fixed source, are shown in FIGS. 5 and 6, respectively. Similar to capacitor Cba, capacitors Cbb and Cbc are sufficiently large to assure DC conditions at Y1 and at X1, respectively. Resistors Rd are added to avoid loading the operational amplifiers with large capacitance. As point Y is connected only to the gate of Qn, where only negligible leakage current flows, $V_Y$ is practically equal to $V_{Y1}$ and resistor Re is not very significant. The situation is different at the gate of Qp (point X), where under pulsed operation the wavefonm differs significantly from $V_{X1}$ and the specific values of Rf, Ct and even the intrinsic PMOS input capacitance Cip are important.

In FIG. 5, Vb can be any available low voltage power supply (e.g. +5 V), while the variable resistor Rp allows pre-setting of $V_{Y1}$ within a desirable range above and below $V_{X1}$, according to the following relations:

$$V_{X1} = Vb(Rc/Ra) - Vbst(Rc/Rb)(Vbst \equiv \text{Variable Source})$$

$$V_{Y1} = Vb[Rc/(Ra - \delta + Rp)] - Vbst(Rc/Rb)(\delta < Rp\max < Ra)$$

Which implies:

$$V_{X1} - V_{Y1} = Vb[Rc(Rp - \delta)]/[Ra(Ra - \delta + Rp)] \equiv \Delta$$

By adjusting Rp between 0 and Rpmax, the necessary value of ($V_{X1}-V_{Y1}$) is obtained. Similarly, another embodiment of $V_{X1}-V_{Y1}=\Delta$ is shown in FIG. 6, as an alternative to section 50 on the top left of FIG. 5. Here $V_{Y1}$ is Vbst, the variable voltage source, while any combination of two available fixed sources provides the required difference $\Delta$. By using fixed voltage sources with the same magnitude and opposite polarity (for example, +5 and −5 Volt), the difference can very between −|Vb|Rp/(2Ry+Rp) and +|Vb|Rp/(2Ry+Rp), according to the position of the center terminal of Rp.

Pre-setting the required value of $\Delta$ which assures no DC current flow through Qp, the actual boosting can take place. This is achieved by the switching action of transistor Qd, the coupling capacitor Ct, resistor Rt and resistor Rf, as follows: When the inverted timing generator pulse at point P rises from low (Gnd) to high, Qd turns abruptly into a powerful current sink, driving its drain node to near ground level. The transient abruptly propagates to the gate of Qp (point X), driving it sharply lower (the exact drop is a fairly complex function of the various components involved). At this point, the short inverter delay td is over and the main shunt Qs, whose gate is driven by the signal at point P2, is turned off, as the signal at P2 drops to Gnd level. With Qp strongly on, a surge of boosting current flows into Co and the DUT, quickly charging node C. Meanwhile, node X rises towards the level $V_{X1}$ in a rate defined by Ct, Cip (the input capacitance of Qp), Rt and Rf, until Qp enters its off state again. The total time from the point Qd turns on and until Qp turns off again must be less than the minimum duration Qd is on, namely (T-t), for all applications and pulse repetition rates supported by the system. In principle, this timing mechanism could be used for terminating the boosting action; however, to assure the adequate boosting to achieve the required level at point C, with no excessive overshoot, an additional mechanism is used. Since |Vds|>0 is necessary for boosting current to flow, setting the voltage at S to about the same level of Vdut (point C) under DC condition (Idc only) will do it properly.

Having the algorithm properly set, once the high level at C reaches its desirable value (the same level reached when Idc flows under DC conditions) Qp will no longer drive boosting current, as its Vds=>0. Shortly after, the voltage at its gate will reach off conditions, to be followed by the waveform at P1 turning to ground potential again. This will immediately turn Qd off, forcing the current from Va through Rt to charge Ct further, causing point X to rise above $V_{X1}$; thus reversing the current direction through Rf. This change of direction, while not directly related to the actual boosting action, is nevertheless effective in restoring the charge Capacitor Cbc loses during the preceding action. This charging, controlled by the values of Rt and Rf, is important, as operational amplifier A has limited current drive. Furthermore, the related timing can be shortened as necessary by placing diode D1 across Rf, as shown in FIG. 5 (dashed lines). This charging action continues until the voltage at X reaches a slight peak and then starts to gradually converge toward $V_{X1}$, as the drain of Qd charges up and the charging current through Rt diminishes. The next transition marks the start of another pulsing cycle and so forth.

Essential to the above is a proper algorithm, controlled by a real-time computer and fed by the relevant data measured. The first step is setting up Idc to the proper level with switch S1 open, no timing generator applied at P and with Vbst set to a level resulting in $V_{X1}$=>0, or even slightly negative if necessary. The voltage at point C is then acquired from the peak detector and stored as reference (hereunder "Vcdc"). Since $V_{X1}$ (and $V_{Y1}$ respectively) are low enough to prevent boosting current, engaging S1 and applying the timing generator at P will turn Qs and Qd on and off accordingly with no boosting current through Qp. Next, the peak detector reading (Vcp) is acquired and compared to Vcdc. If Vcp>Vcdc (very unlikely) then S1 should be disengaged. In the more likely case of Vcp<Vcdc boosting is needed. To initiate boosting, Vbst is increased until the resulting Vcp exceeds Vcdc. At this point, Vcp is decreased and the process is repeated in a converging manner to the point where any further change has negligible effect. From here on, the required pulsing action is in effect. For sufficiently long pulses, the voltage at point C will gradually "converge" to the required level Vcdc even without boosting; however, as the related time constant is significantly longer than short pulses (typically for t<500 nS), such "convergence" provides little help and efficient boosting is necessary. Note that the actual algorithm used for the above iterations is not related to the invention, as it is a matter of efficient convergence. In reality, binary search or similar approaches are effective, but the invention is not limited to one particular algorithm or another and should be held as valid with any iterative algorithm used.

Figure 7:
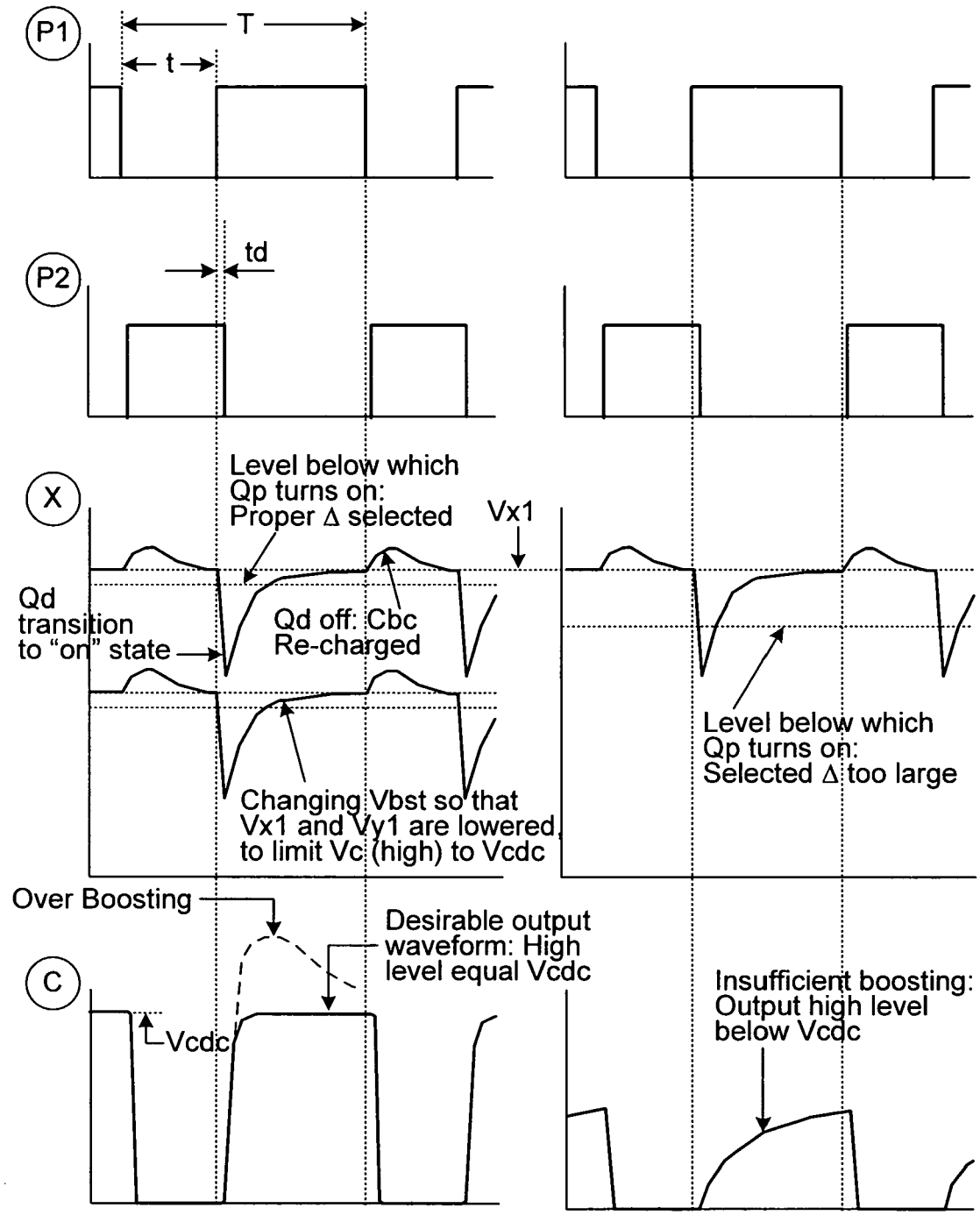
FIG. 7 illustrates waveforms in the circuit of FIG. 5 with proper setting and improper setting, respectively, for charge boosting.

The waveforms in FIG. 7 provide more details as to the waveforms at points P1, P2, X and C (refer to FIG. 5). The left hand side shows proper setting of $\Delta$ ($V_{X1}$−$V_{Y1}$), leading to the expected output waveform. The right hand side shows insufficient boosting and the resulting improper output waveform due to excessive magnitude of $\Delta$.

While the invention has been described with reference to specific embodiments, the description is illustrative of the invention and is not to be construed as limiting the invention. Various modifications and applications may occur to those skilled in the art with out departing from the true spirit and scope of the invention as defined by the appended claims.

What is claimed is:

1. A pulsed current generator circuit comprising:
   a) a current source for applyinig a current to a device under test,
   b) a controlled current shunt for shunting current from the device under test, and
   c) a booster circuit for supplying a booster current to the device under test when the controlled current shunt is opened and current again flows through the device under test, thereby facilitating recharge of a parasitic capacitance associated with the device under test, the booster circuit comprising an NMOS transistor serially connected with a PMOS transistor between a voltage potential and the parasitic capacitance,
   a capacitor shunting the NMOS transistor for providing a DC voltage at a common point of the NMOS transistor and the PMOS transistor, and
   control circuitry coupled to receive a shunt control signal and in response thereto control conduction on the PMOS transistor and provision of the booster current.

2. The pulsed current generator circuit as defined by claim 1 wherein the DC voltage at the common point is approximately equal to the desired voltage on the parasitic capacitor.

3. The pulsed current generator circuit as defined by claim 2 wherein the booster circuit includes bias circuitry for the NMOS transistor and PMOS transistor whereby bias voltage on the PMOS transistor is larger than the bias voltage on the NMOS transistor by a voltage increment, D, whereby both transistors are not conductive during steady state conditions.

4. The pulsed current generator circuit as defined by claim 3 wherein the bias circuitry comprises first and second operational amplifiers responsive to a fixed voltage, Vb, and a variable voltage, Vbst.

5. The pulsed current generator circuit as defined by claim 3 wherein the bias circuitry comprises an operational amplifier responsive to a voltage between two fixed voltages of same voltage magnitude and opposite polarity and a variable voltage, Vbst, where Vbst biases the NMOS transistor and the operational amplifier biases the PMOS transistor.

6. The pulsed current generator circuit as defined by claim 3 and including a resistor connecting the PMOS transistor to the device under test to limit boosting current.

7. The pulsed current generator circuit as defined by claim 3 wherein the control circuitry includes cascade buffers for inverting and delaying input signals applied thereto, one buffer controlling the application of a conduction bias to the PMOS transistor in response to the shunt control signal switching to a voltage level to open the controlled current shunt.

8. The pulsed current generator circuit as defined by claim 1 and including a resistor connecting the PMOS transistor to the device under test to limit boosting current.

9. The pulsed current generator circuit as defined by claim 1 wherein the control circuitry includes cascade buffers for inverting and delaying input signals applied thereto, one buffer controlling the application of a conduction bias to the PMOS transistor in response to the shunt control signal switching to a voltage level to open the controlled current shunt.

* * * * *